United States Patent
Yoon

(10) Patent No.: US 12,247,939 B2
(45) Date of Patent: Mar. 11, 2025

(54) INGOT GROWING APPARATUS AND MONITORING METHOD THEREOF

(71) Applicant: SK SILTRON CO., LTD., Gumi-si (KR)

(72) Inventor: Min Jae Yoon, Gumi-si (KR)

(73) Assignee: SK SILTRON CO., LTD., Gumi-si (KR)

(*) Notice: Subject to any disclaimer, the term of this patent is extended or adjusted under 35 U.S.C. 154(b) by 282 days.

(21) Appl. No.: 18/172,951

(22) Filed: Feb. 22, 2023

(65) Prior Publication Data
US 2023/0296543 A1    Sep. 21, 2023

(30) Foreign Application Priority Data

Mar. 15, 2022 (KR) .................. 10-2022-0032347

(51) Int. Cl.
*G06T 7/00* (2017.01)
*G01N 25/72* (2006.01)
*G06T 7/62* (2017.01)

(52) U.S. Cl.
CPC ........... *G01N 25/72* (2013.01); *G06T 7/0006* (2013.01); *G06T 7/62* (2017.01); *G06T 2207/30148* (2013.01)

(58) Field of Classification Search
CPC .. G01R 15/202; G01R 31/3278; H01H 35/26; G01N 1/24; G01N 9/002; G01N 25/72; G06T 2207/30148; G06T 7/0006; G06T 7/62
See application file for complete search history.

(56) References Cited

U.S. PATENT DOCUMENTS

| | | | |
|---|---|---|---|
| 11,587,792 B2* | 2/2023 | Saito | B28D 5/04 |
| 2016/0032484 A1* | 2/2016 | Kim | C30B 15/20 |
| | | | 117/14 |

FOREIGN PATENT DOCUMENTS

| | | |
|---|---|---|
| JP | 08-239293 A | 9/1996 |
| KR | 10-1481442 B1 | 1/2015 |
| KR | 10-1956455 B1 | 6/2019 |
| KR | 10-2020-0098606 A | 8/2020 |

OTHER PUBLICATIONS

Korean Office Action for KR Application No. 10-2022-0032347 dated Nov. 27, 2023, 6 pages.

* cited by examiner

*Primary Examiner* — Phuoc H Doan
(74) *Attorney, Agent, or Firm* — Lewis Roca Rothgerber Christie LLP

(57) ABSTRACT

An apparatus for growing an ingot from a melt accommodated in a crucible of a chamber comprises a first senor and a controller.
The first sensor is installed on one side of the chamber for detecting a detection signal in real time from a side portion of the ingot. The side portion of the ingot rotates via a detection area focused by the first sensor. The controller obtains a detection signal at each of a plurality of sampling points based on detection signals detected in real time, obtains a value of a central point of the ingot based on the detection signal at each of the plurality of sampling points, and determines whether or not the ingot is defective based on the value of the central point of the ingot.

20 Claims, 11 Drawing Sheets

Region B

INGOT GROWING APPARATUS AND MONITORING METHOD THEREOF

CROSS-REFERENCE TO RELATED APPLICATION

This application claims priority to Korean Patent Application Number 10-2022-0032347, filed on Mar. 15, 2022, the entire content of which is incorporated herein by reference.

BACKGROUND

The embodiment relates to an ingot growing apparatus and a monitoring method thereof.

A silicon single crystal, which is a basic material of semiconductor integrated circuit, is manufactured by the Czochralski method.

In the CZ method, a silicon single crystal ingot can be grown from a raw material melt by using a seed crystal by putting a raw material melt in a crucible and heating the crucible.

It is very important to grow the silicon single crystal ingot with a uniform diameter.

However, an orbit occur due to non-uniform rotation in the growth process. Or the ingot grown through the seed of the cable has a dog leg due to a set-up problem or temperature asymmetry of the devices in the chamber. For example, as the setup problem, there is a cable problem or the like. In addition, the orbit or the dog leg occurs because the thermal environment is not optimized due to the set-up problem of subsidiary such as hot zone.

Considering the occurrence of the orbit or the dog leg, the ingot is grown to a diameter larger than the diameter requested by the customer. The ingot grown in this way can be processed to the required diameter of the customer through grinding.

However, if the orbit or the dog leg is severe, even if the grinding process is not performed, the grown ingot may be partially or entirely discarded because it is smaller than the customer's required diameter.

Meanwhile, currently, no technology has been developed to monitor the orbit or the dog leg in real time as the ingot grows. Accordingly, there is an inconvenience in that the ingot growing apparatus has to be stopped until the inspection result on whether or not the dog leg occurs in the produced ingot comes out. In addition, even if the occurrence of the dog leg is confirmed and a detailed inspection is performed after stopping the ingot growing apparatus, it is difficult to determine the cause if the problem is not the ingot growing apparatus itself.

On the other hand, even if the dog leg partially occurs in the ingot, if the degree of occurrence is not severe, the dog leg can be removed through grinding after block cutting around a part where the dog leg occurs. However, since block cutting must be performed for this purpose, there is a problem in that productivity decreases due to increased process time.

SUMMARY

An object of embodiments is to solve the foregoing and other problems.

The other object of the embodiment is to provide an ingot growing apparatus and a monitoring method capable of monitoring ingot-related defects such as orbit or dog leg in real time along with ingot growth.

In addition, another object of the embodiments is to provide an ingot growing apparatus and a monitoring method capable of determining whether or not the ingot is completely or partially discarded based on ingot-related defects in real time along with the ingot growth.

Another object of the embodiments is to provide an ingot growing apparatus and a monitoring method capable of preventing unnecessary block cutting of the ingot.

The technical problems of the embodiments are not limited to those described in this section, and include those that can be grasped through the description of the invention.

According to a first aspect of the embodiment to achieve the above or other object, an apparatus for growing an ingot from a melt accommodated in a crucible of a chamber, comprising: a first sensor installed on one side of the chamber for detecting a detection signal in real time from a side portion of the ingot; and a controller, wherein the side portion of the ingot rotates via a detection area focused by the first sensor, and wherein the controller is configured: to obtain a detection signal at each of a plurality of sampling points based on detection signals detected in real time, to obtain a value of a central point of the ingot based on the detection signal at each of the plurality of sampling points, and to determine whether or not the ingot is defective based on the value of the central point of the ingot.

The plurality of sampling points are set at least three or more along the side circumference of the ingot.

The value of the central point of the ingot is a value of a central point of a polygon having each of the plurality of sampling points as a vertex.

The controller compares a difference value between the obtained value of the central point of the ingot and a value of a central point of the chamber and a threshold value, and determines the ingot as defective when the obtained difference value between the obtained value of the central point of the ingot and a value of a central point of the chamber exceeds the threshold value.

The controller determines the ingot as normal when the value of the obtained central point of the ingot is identical to the value of the central point of the chamber.

The controller determines the ingot as normal when the difference value between the obtained value of the central point of the ingot and the value of the central point of the chamber is less than or equal to the threshold value.

The apparatus further comprises a display unit. The controller displays a shape of the ideal ingot, a shape of a critical loop surrounding the shape of the ideal ingot, and a shape of the ingot on the display unit.

The controller monitors a defect in the ingot in real time, and transmits at least one defect-related information to at least one site when the defect in the ingot occurs during the monitoring.

The apparatus further comprises a second sensor configured to obtain thermal image information of the ingot. The defect of the ingot includes a dog leg. The controller determines whether or not the cause of the dog leg is due to temperature asymmetry or a setup problem of devices in the chamber based on the thermal image information.

According to a second aspect of the embodiment, a monitoring method in an apparatus for growing an ingot from a melt accommodated in a crucible of a chamber, the apparatus comprising a first sensor installed on one side of the chamber for detecting a detection signal in real time from a side portion of the ingot, and the side portion of the ingot rotating via a detection area focused by the first sensor, comprising: obtaining a detection signal at each of a plurality of sampling points based on detection signals detected in real time; obtaining a value of a central point of the ingot based on the detection signal at each of the plurality of sampling points; and determining whether or not the ingot is defective based on the value of the central point of the ingot.

The plurality of sampling points are set at least three or more along the side circumference of the ingot.

The value of the central point of the ingot is a value of a central point of a polygon having each of the plurality of sampling points as a vertex.

The determining of whether or not the ingot is defective comprises: comparing a difference value between the obtained value of the central point of the ingot and a value of a central point of the chamber and a threshold value, and determining the ingot as defective when the obtained difference value between the obtained value of the central point of the ingot and a value of a central point of the chamber exceeds the threshold value.

The determining of whether or not the ingot is defective comprises: determining the ingot as normal when the value of the obtained central point of the ingot is identical to the value of the central point of the chamber.

The determining of whether or not the ingot is defective comprises: determining the ingot as normal when the difference value between the obtained value of the central point of the ingot and the value of the central point of the chamber is less than or equal to the threshold value.

The apparatus comprises a display unit. The monitoring method comprises displaying a shape of the ideal ingot, a shape of a critical loop surrounding the shape of the ideal ingot, and a shape of the ingot on the display unit.

The monitoring method comprises monitoring a defect in the ingot in real time; and transmitting at least one defect-related information to at least one site when the defect in the ingot occurs during the monitoring.

The apparatus comprises a second sensor configured to obtain thermal image information of the ingot, and the defect of the ingot includes a dog leg. The monitoring method comprises determining whether or not the cause of the dog leg is due to temperature asymmetry or a setup problem of devices in the chamber based on the thermal image information.

The effects of the ingot growing apparatus and monitoring method thereof according to the embodiment are as follows.

According to at least one of the embodiments, during the growth of the ingot, different detection signals may be sensed in real time along the side circumference of the ingot according to a shape protruding outward or retracting in an inward direction. In this way, the detection signal corresponding to each of a plurality of sampling signals can be selected from the detection signals sensed in real time. A value of a central point of the ingot can be obtained based on the detection signal corresponding to each of the obtained plurality of sampling signals. The value of the central point of the ingot can vary according to the growth direction of the ingot when the orbit or the dog leg occurs.

Defectiveness of the ingot may be determined based on the value of the central point of the ingot. For example, when the difference value between the value of the central point of the ingot and the value of the central point of the chamber exceeds a threshold value, the corresponding ingot may be determined as a defective ingot. The threshold value may be set in consideration of the relationship between the target diameter and the diameter required by the customer. The target diameter may be larger than the diameter required by the customer. In this case, the threshold value may be a minimum value at which an ingot can be processed to remove an orbit or a dog leg even when the orbit or the dog leg occurs, and an ingot having a minimum diameter required by the customer can be produced.

Therefore, according to the embodiment, by monitoring ingot growth in real time, it is possible to easily identify the defective ingot that cannot be reused due to processing, etc., thereby significantly reducing cost and improving productivity by shortening process time.

A further scope of applicability of the embodiments will become apparent from the detailed description that follows. However, since various changes and modifications within the spirit and scope of the embodiments can be clearly understood by those skilled in the art, it should be understood that the detailed description and specific embodiments, such as preferred embodiments, are given by way of example only.

DETAILED DESCRIPTION OF THE EMBODIMENTS

Figure 1:
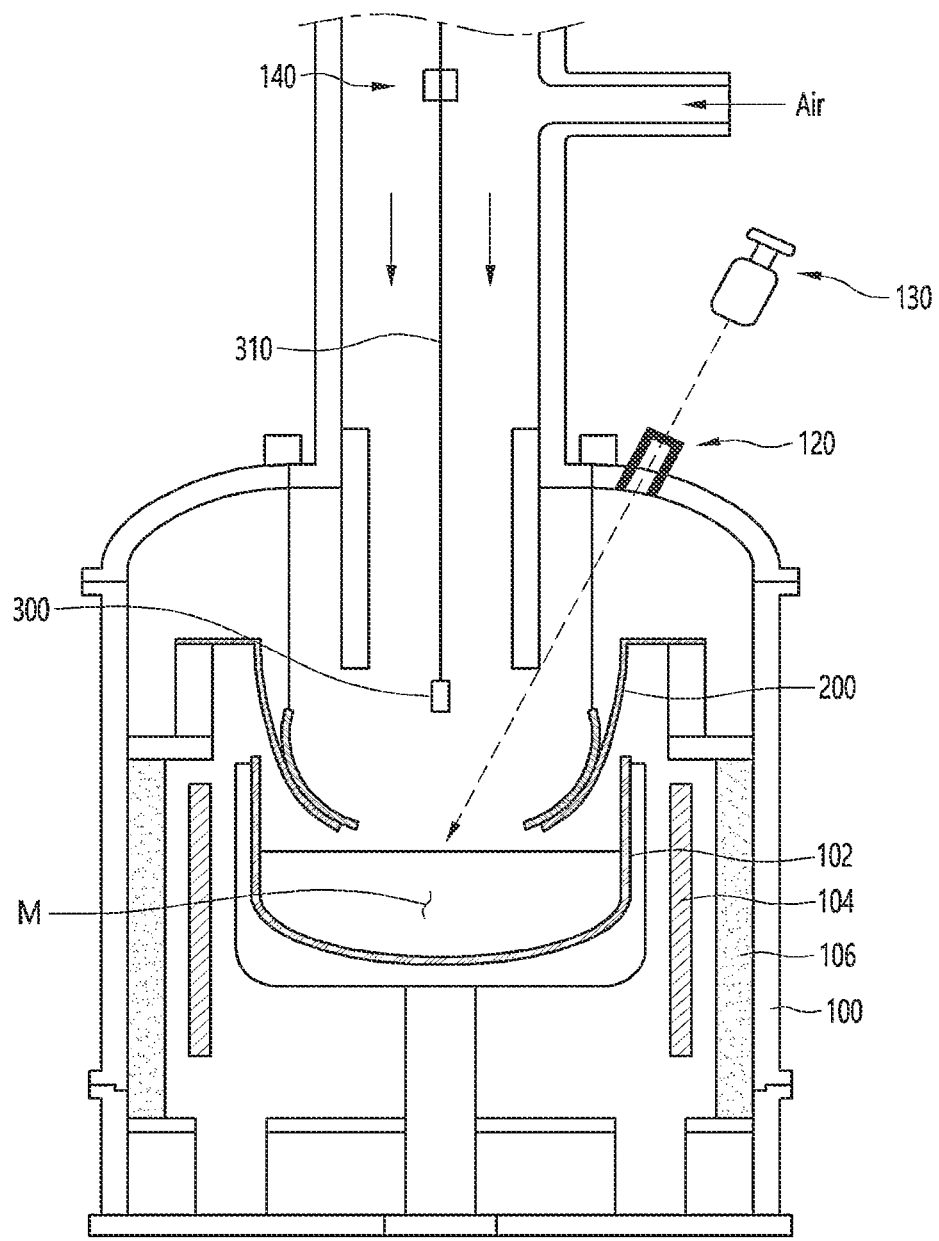
FIG. 1 is a cross-sectional view showing an ingot growing apparatus according to an embodiment.

Hereinafter, the embodiments disclosed in this specification will be described in detail with reference to the accompanying drawings, but the same or similar components are given the same reference numerals regardless of reference numerals, and redundant descriptions thereof will be omitted. The suffixes 'module' and 'portion' for the components used in the following descriptions are given or used interchangeably in consideration of ease of writing the specification, and do not themselves have a meaning or role that is distinct from each other. In addition, the accompanying drawings are for easy understanding of the embodiments disclosed in this specification, and the technical idea disclosed in this specification is not limited by the accompanying drawings. Also, when an element such as a layer, region or substrate is referred to as being 'on' of another element, this includes being directly on another element or having other intermediate elements in between.

FIG. 1 is a cross-sectional view showing an ingot growing apparatus according to an embodiment.

Referring to FIG. 1, an ingot growing apparatus according to an embodiment may comprise a chamber 100, a crucible 102, a heater 104, a first heat shield 106, and a second heat shield 200.

The chamber 100 provides a space in which predetermined processes for growing a silicon single crystal ingot, which is a basic material of a semiconductor integrated circuit, are performed.

The crucible 102 is a hot zone structure installed inside the chamber 100, and the silicon melt M may be accommodated therein. The crucible 102 is connected to a driving device and can be rotated and/or moved up and down.

A heater 104 may be disposed around the outer periphery of the crucible 102. The heater 104 may generate thermal energy to be applied to the crucible 102 to melt polycrystalline silicon.

The first heat shield 106 may be disposed between the chamber 100 and the heater 104 to have insulation capability so that heat applied from the heater 104 to the crucible 102 is not emitted to the outside portion of the chamber 100.

A seed chuck 300 in which a seed for growing a silicon single crystal ingot is accommodated may be disposed on the crucible 102. In addition, a cable 310 for rotating and/or moving up and down the seed chuck 300 may be connected to the seed chuck 300. The cable 310 is connected to the driving device to rotate and/or move up and down.

The second heat shield 200 may be disposed to prevent heat from being discharged from the upper side portion of the crucible 102 to the outside.

As shown in FIG. 1, the ingot growing apparatus according to the embodiment may further comprise a first sensor 130 and a second sensor 140.

The first sensor 130 is installed on one side of the chamber 100 and may detect a detection signal from the side portion of the ingot I in real time. That is, the first sensor 130 may be installed on the viewport 120 disposed on the upper side portion of the chamber 100. The first sensor 130 may be a camera, but is not limited thereto.

Polycrystalline silicon may be melted by the heater 104 to become a melt M.

The seed is accommodated in the seed chuck 300 of the cable 310, and the cable moves down so that the seed of the seed chuck 300 may be immersed in the melt M.

Thereafter, as the cable 310 rotates and/or moves up, the melt M adheres to the seed so that the ingot I may grow. The cable 310 (or the ingot I) may be rotated and/or moved up until the desired length of the ingot I is grown. The ingot may be rotated at a predetermined rotational speed.

Figure 2:
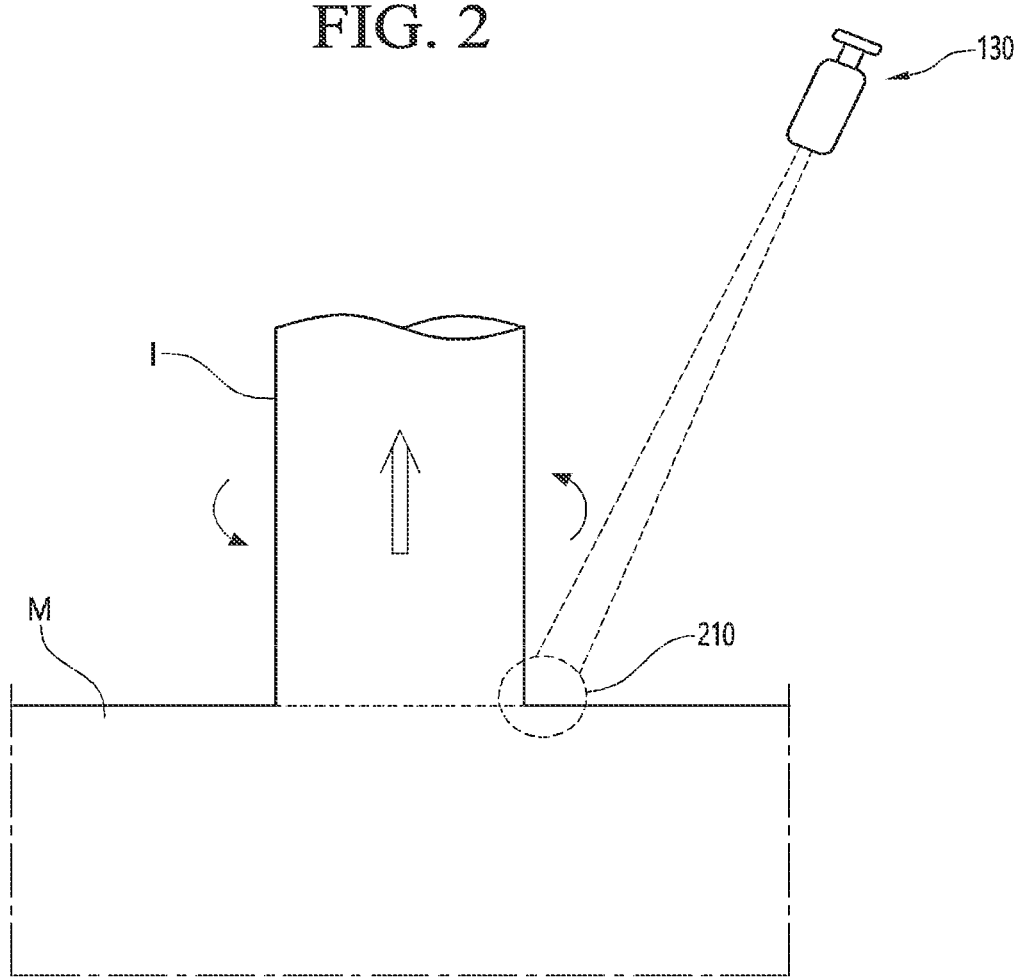
FIG. 2 illustrates sensing a detection signal using a first sensor.
Figure 3:
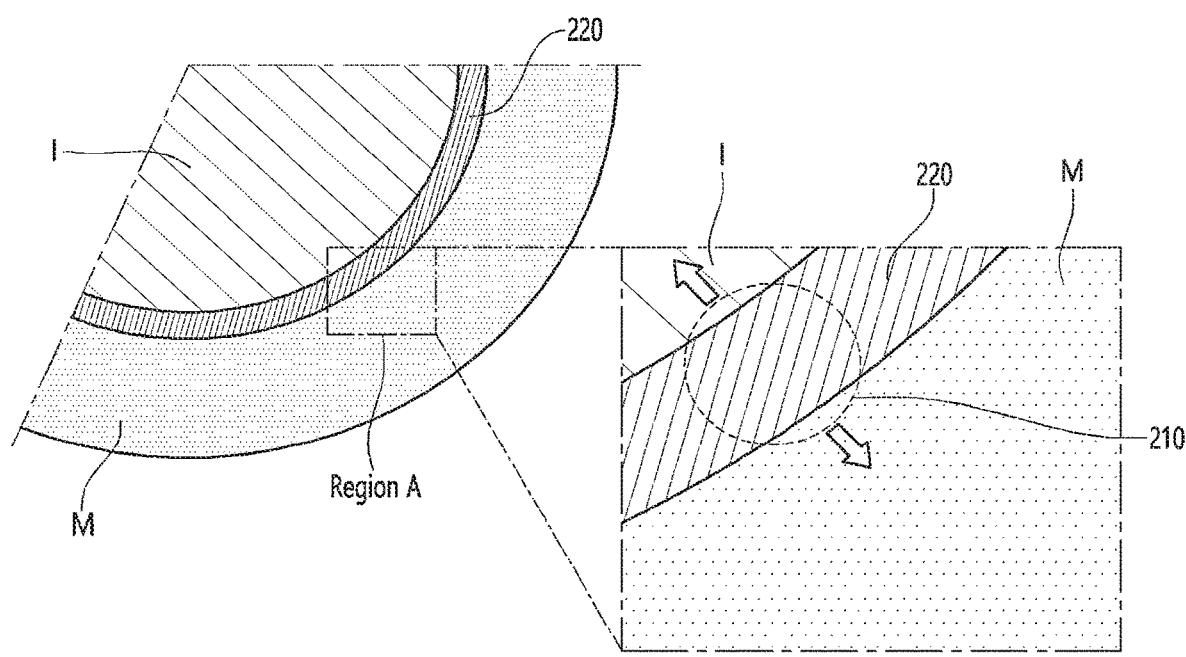
FIG. 3 shows a detection area for obtaining a detection signal.

As shown in FIGS. 2 and 3, a meniscus phenomenon in which a surface of the melt M adjacent to the ingot I appears bright occurs, and an area where this meniscus phenomenon occurs may be defined as a meniscus area 220.

The first sensor 130 may be focused on a detection area 210 to detect the detection signal from the detection area 210. The detection area 210 may be an area where the detection signal can be detected by the first sensor.

When the ingot I is rotated, the side portion of the ingot I may be rotated via the detection area 210 focused on the first sensor 130. The detection area 210 on which the sensor 130 focuses may be a fixed area. Even if the detection area 210 focused by the first sensor 130 is fixed, as the ingot I is rotated, the entire side portion along the circumference of the ingot I may pass through the detection area 210 sequentially. Therefore, the first sensor 130 detects a detection signal from the detection area 210, which includes or adjacent to the side portion of the ingot I passing through the fixed detection area 210 by the rotation of the ingot I. As described above, the ingot I does not grow with a constant diameter due to shaking of the ingot I, asymmetry in temperature, or a setup problem of the devices in the chamber 100. That is, the side portion of the ingot I may be grown so as to protrude outward along the growth direction. When the side portion of the ingot I protrudes outward, the other side portion of the ingot I on the opposite side through the center of the ingot I from the side of the ingot I may have a recessed shape inwardly.

Accordingly, the first sensor 130 may detect the detection signal in real time along the side circumference of the ingot I. For example, the detection area 210 may include at least the meniscus area 220.

For example, the detection signal may include brightness information (or brightness value) of the meniscus area 220.

The brightness value of the meniscus area 220 may vary as the diameter of the ingot I increases or decreases. For example, when the diameter of the ingot I increases, the ingot I expands outward (arrow indicating outward), which may mean that the brightness value of the meniscus area 220 increases. For example, when the diameter of the ingot I decreases, the ingot I shrinks inward (arrow indicating inward), which may mean that the brightness value of the meniscus area 220 decreases.

As will be described later, a detection signal at each of a plurality of sampling points may be selected from detection signals sensed in real time. A plurality of sampling points may be preset.

Figure 4:
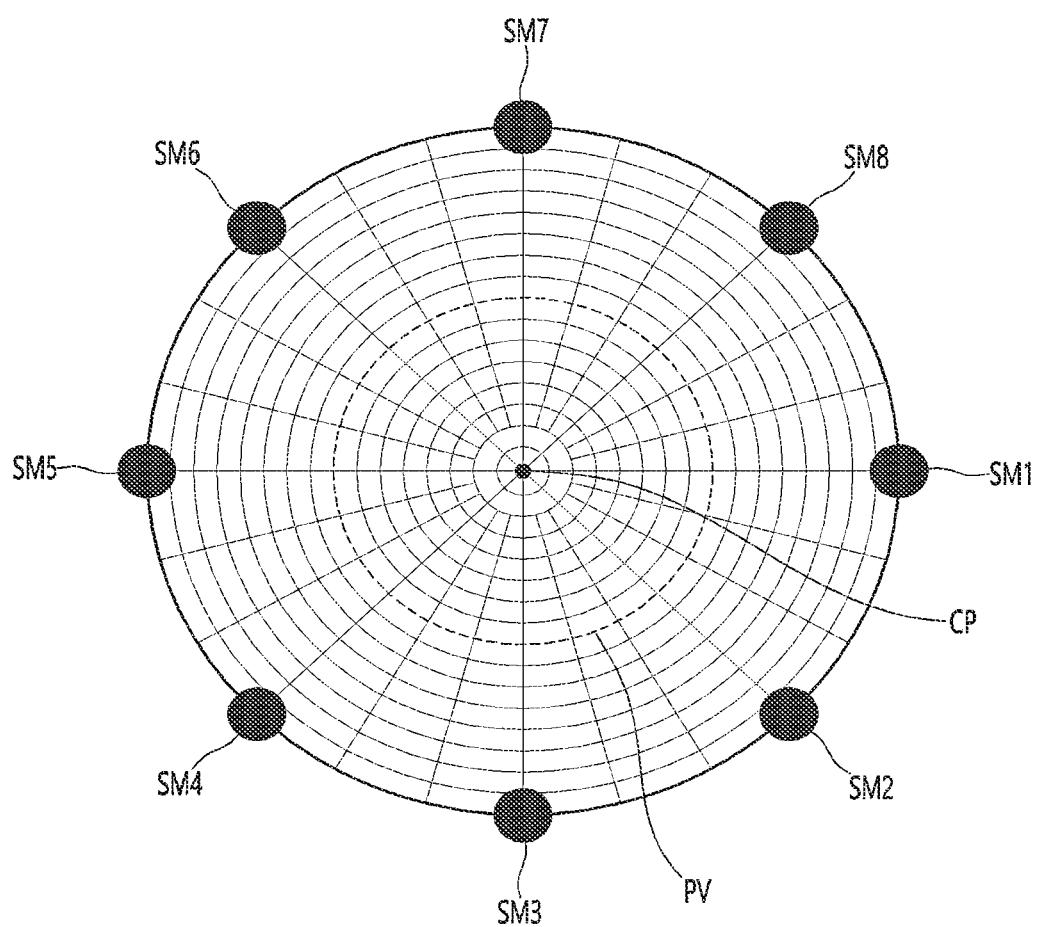
FIG. 4 shows a plurality of sampling points in a polar coordinate system.

As shown in FIG. 4, eight sampling points SM1 to SM8 may be set. For example, the plurality of sampling points SM1 to SM8 may be set along the side circumference of the ingot I.

For example, the eight sampling points SM1 to SM8 may be set at 45° intervals along the side circumference of the ingot I. That is, when the first sampling point SM1 is located at 0°, the second sampling point SM2 may be located at a rotation interval of 45° from the first sampling point SM1. The third sampling point SM3 may be located at a rotation interval of 45° from the second sampling point SM2. In this way, the remaining sampling points SM4 to SM8 may also be located at a rotational interval of 45° from each other.

As described above, the ingot I may be rotated and the first sensor 130 may be focused on the fixed detection area 210. Accordingly, when the side circumference of the ingot I passes through the detection area 210, the brightness value of the meniscus area 220, which is changed as the diameter of the side of the ingot I increases or decreases, may detected as a detection signal a real time. In this way, among the detection signals sensed in real time along the side circumference of the ingot I, detection signals corresponding to preset sampling points SM1 to SM8 may be selectively obtained. For example, when eight sampling points SM1 to SM8 are set, detection signals for each of the eight sampling points SM1 to SM8 may be selectively obtained.

Meanwhile, although not shown, three sampling points may be set at 120° intervals along the side circumference of the ingot I. Also, although not shown, four sampling points may be set at 90° intervals along the side circumference of the ingot I.

The plurality of sampling points SM1 to SM8 are for determining a central point of the ingot, and may be set to at least three.

It will be described in detail later to determine the defects of the ingot I based on the detection signal of each of the plurality of sampling points SM1 to SM8.

Meanwhile, the second sensor 140 may be installed on one side of the cable 310, for example. Although not shown, the second sensor 140 may be installed on another viewport. The second sensor 140 may be a pyrometer sensor, but is not limited thereto.

The second sensor 140 may obtain thermal image information of the ingot I. For example, the thermal image information may be temperature distribution information.

The cause of the dog leg defect, which is the defect of the ingot I, may be determined based on the thermal image information of the ingot I obtained from the second sensor 140, and will be described in detail later.

Although not shown, a sensor for detecting the rotation number of the ingot I may be installed in a predetermined area of the chamber 100. For example, the corresponding sensor may be installed in a predetermined area of the cable 310.

Meanwhile, as ingot defects, there are orbit, dog leg, and the like. The orbit may be a defect that grows asymmetrically as the ingot is shaken. The dog leg may be a defect in which the ingot is not grown to the same diameter and the outer surface is grown in a zigzag shape due to temperature asymmetry or a setup problem of devices in the chamber 100. When the dog leg occurs, the central point of the ingot may be located like a whirlwind according to the growth direction.

Figure 5:
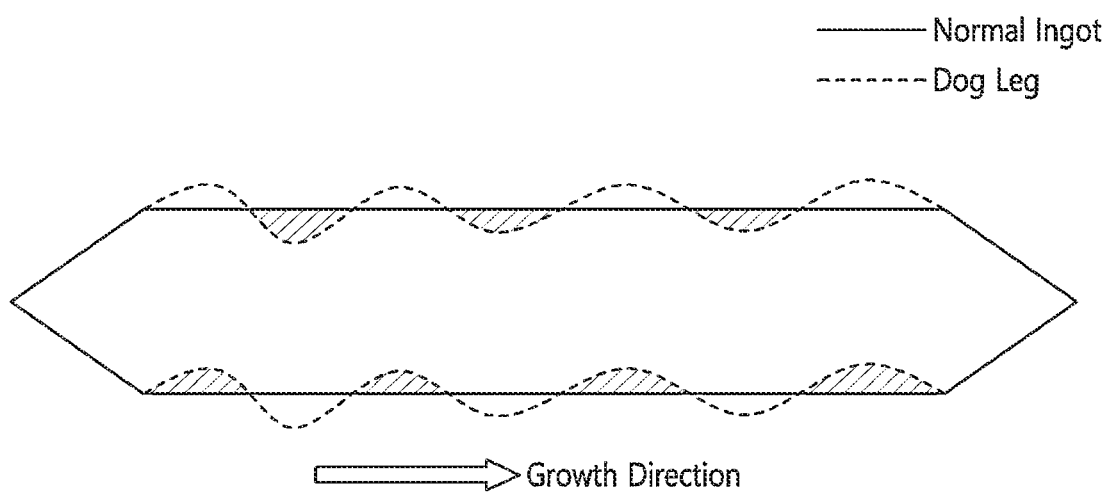
FIG. 5 shows a normal ingot and an ingot with dog leg.

As shown in FIG. 5, it can be seen that dog legs occur along the growth direction at the same sampling points SM1 to SM8 shown in FIG. 4. For example, the central point of the ingot is shifted to the left side and then shifted to the right side repeatedly according to the growth direction. When the central point of the ingot is skewed to the left side, it may have a shape that protrudes from the left side and goes into the left side from the right side compared to a normal ingot in the corresponding section. When the central point of the ingot is skewed to the right side, it may have a shape that goes into the right side from the left side and protrudes from the right side compared to the normal ingot.

In general, even if the dog leg occurs, the ingot grown in this way may be side-processed to a diameter required by the customer. In this case, the leftward or rightward recessed part through the side processing may be removed and made into a flat shape.

However, if the degree of indentation to the left or right in the ingot where the dog leg occurred is severe, that is, if the degree of indentation to the left or right exceeds a threshold value, even if the side processing is performed, it does not form a flat shape and it may be still be left or right indented. In this case, since the diameter is smaller than the diameter requested by the customer, the corresponding section of the ingot or the entire ingot may be determined to be defective and discarded.

In FIG. 5, the left side may be the first sampling point (SM1 in FIG. 4) and the right side may be the fifth sampling point (SM5 in FIG. 4). Accordingly, it can be seen that a dog leg occurs according to the growth direction at each of the first sampling point SM1 and the fifth sampling point SM5.

According to the embodiment, the growth of the ingot may be monitored. As a result of this monitoring, the occurrence of the dog leg or the orbit may be identified. In addition, even if the dog leg or the orbit occurs, whether or not the ingot to be discarded may be determined based on the threshold value.

Figure 6:
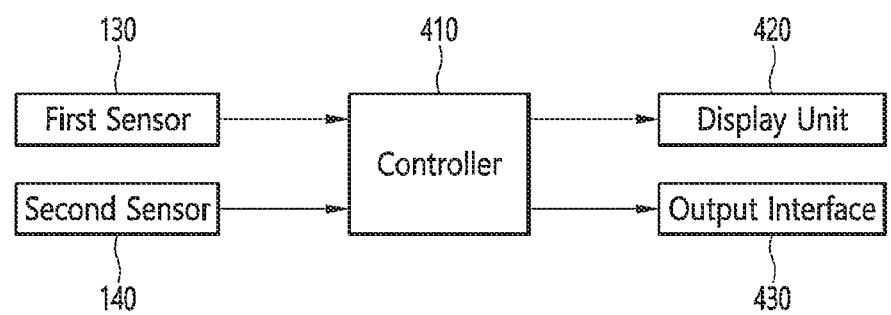
FIG. 6 is a block diagram showing an ingot growing apparatus according to an embodiment.

FIG. 6 is a block diagram showing an ingot growing apparatus according to an embodiment.

Referring to FIG. 6, the ingot growing apparatus according to the embodiment may comprise a first sensor 130, a second sensor 140, and a controller 410. The ingot growing apparatus according to the embodiment may comprise more components than these.

The first sensor 130 may detect a detection signal in real time from the side portion of the ingot.

The controller 410 may obtain a detection signal at each of a plurality of sampling points based on the detection signal detected in real time, obtain a value of the central point of the ingot based on the detection signal at each of the plurality of sampling points, and determine whether or not the ingot is defective based on the value of the central point of the ingot.

Figure 9A:
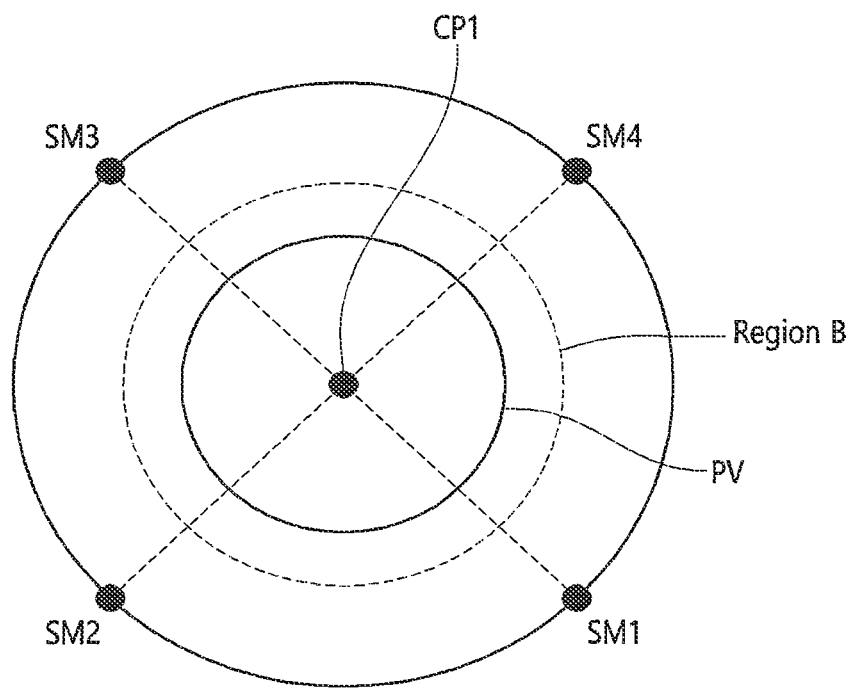
FIG. 9A is a diagram illustrating a polar coordinate system.
Figure 9B:
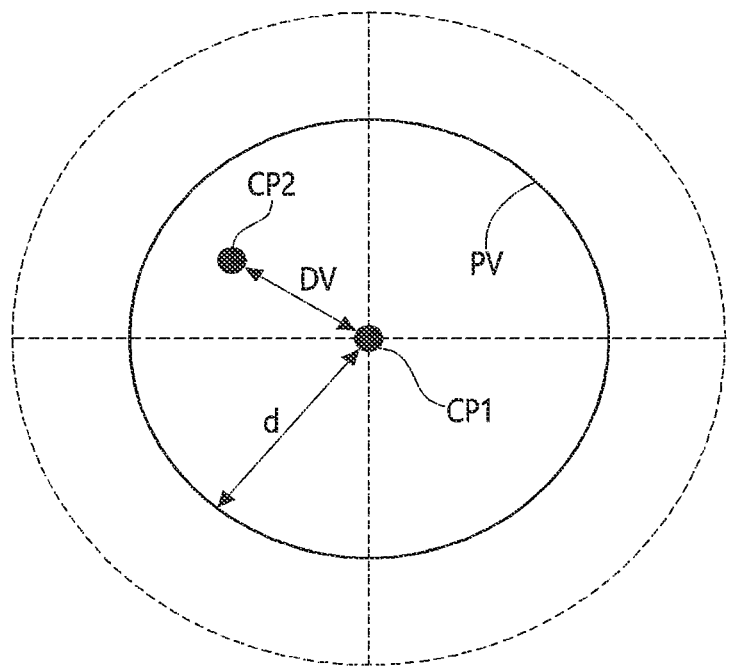
FIG. 9B is an enlarged view of region B of FIG. 9A.

As shown in FIGS. 9A and 9B, the central point CP1 of the chamber 100, a threshold value PV, and the plurality of sampling points SM1 to SM4 may be located (or displayed) in a polar coordinate system. The plurality of sampling points SM1 to SM4 may be differently located on the polar coordinate system according to the detection signal, that is, the brightness value of the meniscus area 220. That is, when the detection signal at each of the plurality of sampling points SM1 to SM4 is changed, the position of each of the plurality of sampling points SM1 to SM4 in the polar coordinate system may be also changed.

Although the number of sampling points SM1 to SM4 is illustrated in FIG. 9A as four, this is only an example and three or more than five points may be provided. The threshold value PV may be set differently according to the target diameter or the operator's request.

Among the detection signals detected in real time, detection signals corresponding to each of the plurality of sampling points SM1 to SM4 may be selectively obtained.

In this case, the controller 410 may obtain a value of the central point CP2 of the ingot based on the detection signal of each of the plurality of sampling points SM1 to SM4. The value of the central point CP2 of the ingot may be located in the polar coordinate system.

As described above, when the orbit or the dog leg occurs during the growth of the ingot, the diameter of the ingot is changed so that the side portion of the ingot protrudes or shrinks outward, and the degree of protrusion or shrinkage may be different. This degree of differentiation may be detected as a brightness information of the meniscus area 220, that is, a detection signal.

Therefore, the detection signal at each of the plurality of sampling points SM1 to SM4, that is, the brightness information of the meniscus region 220 may be changed according to the growth direction of the ingot, and the value of the central point CP2 of the ingot obtained based on the detection signal at each of the plurality of sampling points SM1 to SM4 may also changed.

If the central point CP2 of the ingot obtained according to the growth direction of the ingot is constant, the ingot may grow with a constant diameter according to the growth direction.

If the central point CP2 of the ingot is not constant according to the growth direction of the ingot, the ingot is grown with a diameter that is not constant according to the growth direction, and in particular, an orbit or a dog leg may occur.

For example, the value of the central point CP2 of the ingot may be the value of the central point of a polygon having each of the plurality of sampling points SM1 to SM4 as vertex point, but is not limited thereto. Here, the central point of the polygon may be the center of gravity of the polygonal ingot. For example, when the density of the ingot is the same in all regions, the central point of the polygon and the central point of gravity of the ingot may coincide.

For example, the central point CP2 of the ingot may be obtained by converting the plurality of sampling points SM1 to SM4 into an XY coordinate system and then adding detection signals in the converted XY coordinate system, but is not limited thereto.

Meanwhile, the threshold value PV may be located in a polar coordinate system. For example, the threshold value PV may have a loop shape. The central point of the polar coordinate system may be, for example, the central point CP1 of the chamber 100. The central point CP1 of the chamber 100 may be fixed. The central point CP1 of the chamber 100 may be a location of a cable within the chamber 100. The central point CP1 of the chamber 100 is a fixed point. Thus, the defect of the ingot may be determined based on how much the central point CP2 of the ingot deviates from the central point CP1 of the chamber 100.

For example, the threshold value PV having a loop shape may be a value that is spaced apart from the central point CP1 of the chamber 100 by a distance of d. Since the threshold value PV may be spaced apart from the central point CP1 of the chamber 100 by the same distance d along the loop.

When the central point CP2 of the ingot is located in a region other than the central point CP1 of the chamber 100, it may indicate that there is a possibility of defectiveness.

For example, when the value of the central point CP2 of the ingot is greater than the threshold value PV, that is, the distance d, the ingot may be determined to be defective.

More specifically, the controller 410 may compare a difference value DV between the value of the central point CP2 of the ingot and the value of the central point CP1 of the chamber 100 and the threshold value PV, and determine that the ingot is defective when the difference value DV between the obtained value of the central point CP2 of the ingot and the value of the central point CP1 of the chamber 100 exceeds the threshold value PV. That is, when the obtained difference value DV between the value of the central point CP2 of the ingot and the value of the central point CP1 of the chamber 100 exceeds the distance d, the controller 410 may determine that the ingot is defective. An ingot determined to be defective may have severe orbit or dog leg, which means that it cannot be reused even by processing and should be discarded.

For example, when the central point CP1 of the chamber 100 is 0, the difference value DV may be the value of the central point CP2 of the ingot.

The controller 410 may determine that the corresponding ingot is normal when the value of the central point CP2 of the ingot coincides with the value of the central point CP1 of the chamber 100 or the difference DV between the value of the central point CP2 of the ingot and the value of the central point CP1 of the chamber 100 is less than or equal to the threshold value PV.

According to the embodiment, by monitoring the entire growth process of the ingot and determining a normal ingot and a defective ingot for each section, only the ingot corresponding to the defective section is discarded, and the ingot corresponding to the normal section can be made into the diameter required by the customer through processing, etc. Accordingly, it is possible to reduce costs by preventing ingots that are indiscriminately discarded.

The ingot growing apparatus according to the embodiment may comprise a display unit 420 and an output interface 430.

Figure 10A:
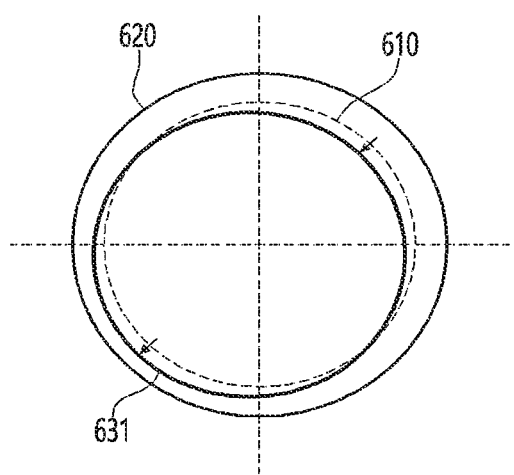
FIG. 10A shows that the actual ingot is determined to be normal by comparing the shape of the actual ingot with the shape of the critical loop.
Figure 10B:
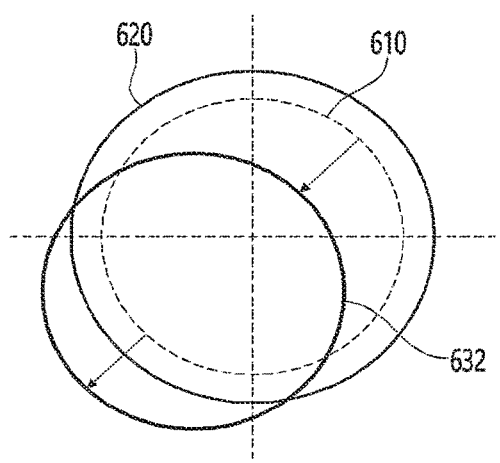
FIG. 10B shows that the actual ingot is determined to be defective by comparing the shape of the actual ingot with the shape of the critical loop.

For example, as shown in FIGS. 10A and 10B, the controller 410 may display a shape 610 of the ideal ingot, a shape 620 of the critical loop surrounding the shape 610 of the ideal ingot, and shapes 631 and 632 of the actual ingot that has grown through the growth process on the display unit 420.

An operator can easily determine whether or not the ingot is defective through a relationship between the shapes 631 and 632 of the actual ingot and the shape 620 of the critical loop.

As shown in FIG. 10A, when the shape 631 of the actual ingot grown through the growth process is not be identical to the shape 610 of the ideal ingot but is located within the critical loop, the ingot may be determined as a normal ingot.

As shown in FIG. 10B, when the shape 632 of the actual ingot grown through the growth process deviates from the critical loop, the corresponding ingot may be determined as a defective ingot. The defective ingot may be due to, for example, a dog leg, but is not limited thereto.

The operator may immediately take follow-up measures according to whether or not the ingot is defective, which is determined through the relationship between the shapes 631 and 632 of the actual ingot and the shape 620 of the critical loop.

The output interface 430 may be, for example, a speaker. The controller 410 may monitor defects in the ingot in real time, and output defect-related information through the output interface 430 when a defect in the ingot occurs during monitoring.

Meanwhile, the controller 410 may monitor defects in the ingot in real time, and transmit defect-related information to at least one or more sites when defects in the ingot occur during monitoring. Here, the site may be a production site, an office, a server, a management center, and the like. The defect-related information may be displayed on the display unit 420 provided in these sites. The defect-related information may include information shown in FIGS. 10A and 10B, information on measures to be taken when a defect occurs, information on new process conditions to be changed, and the like.

Figure 11:
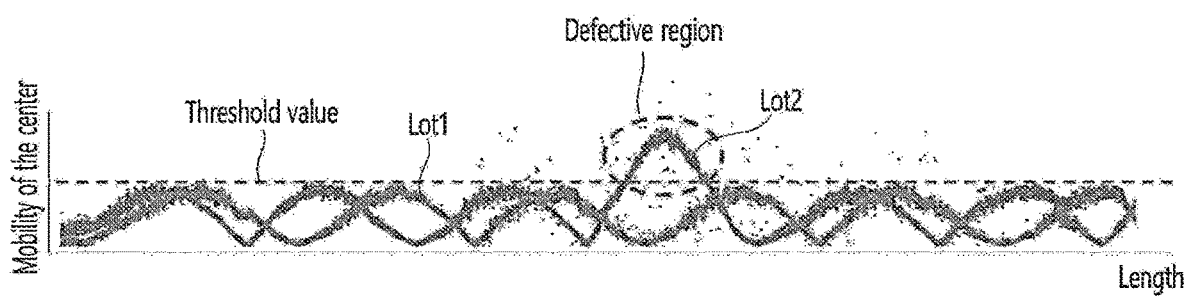
FIG. 11 shows the monitoring of a plurality of lots within the same chamber.

On the other hand, as shown in FIG. 11, the controller 410 can monitor each of a plurality of lots lot1 and lot2 to easily determine whether or not a defect has occurred in a specific lot or specific section. If the mobility of the center of the ingot is out of the threshold value in a specific section, the corresponding section can be easily recognized as a defective area.

Although not shown, the controller 410 monitors each equipment (or chamber 100) to easily determine whether or not a defect has occurred in a specific equipment, a specific lot, or a specific section.

Meanwhile, the second sensor 140 may obtain thermal image information of the ingot. The second sensor 140 may be a thermometer sensor.

The controller 410 may determine whether or not the cause of the dog leg is due to temperature asymmetry or a setup problem of devices in the chamber 100 based on the thermal image information obtained by the second sensor 140. Whether or not the ingot is defective may be determined before determining whether or not the ingot is due to temperature asymmetry or a setup problem of devices in the chamber 100. That is, only when the ingot is determined to be defective, it may be determined whether or not the cause of the dog leg is due to temperature asymmetry or a setup problem of the devices in the chamber 100 based on the thermal image information from the second sensor 140.

Figure 14A:
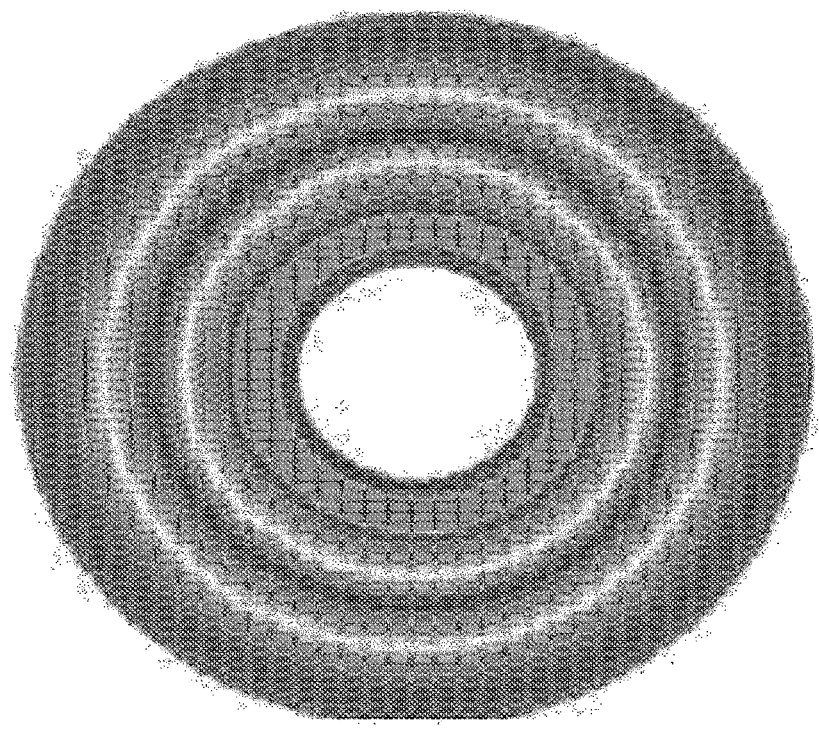
FIGS. 14A and B show that the causes of normality and abnormality are determined using thermal image information.
Figure 14B:
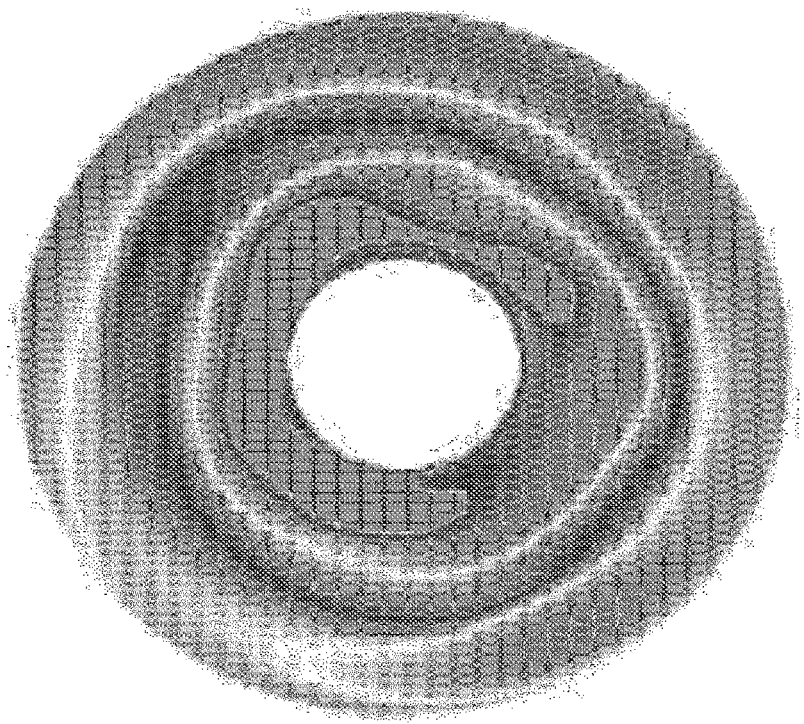

As shown in FIGS. 14A and 14B, the temperature distribution included in the thermal image information is seen in stages from the center to the side portion of the ingot. That is, it may increase in stages from the center of the ingot to the side. At this time, the temperature at each step may have an edge shape.

As shown in FIG. 14A, since the edge shape for temperature at each step is constant from the center to the side portion of the ingot, that is, it is symmetrical, the corresponding ingot can be determined as a normal ingot.

As shown in FIG. 14B, since the edge shape for temperature at each step is not constant from the center to the side portion of the ingot, that is, it is asymmetric, the ingot may be determined to be an abnormal or asymmetric ingot. From the thermal image information shown in FIG. 14B, it can be easily determined or recognized that the defect of the corresponding ingot, that is, the dog leg is due to temperature asymmetry.

Figure 7:
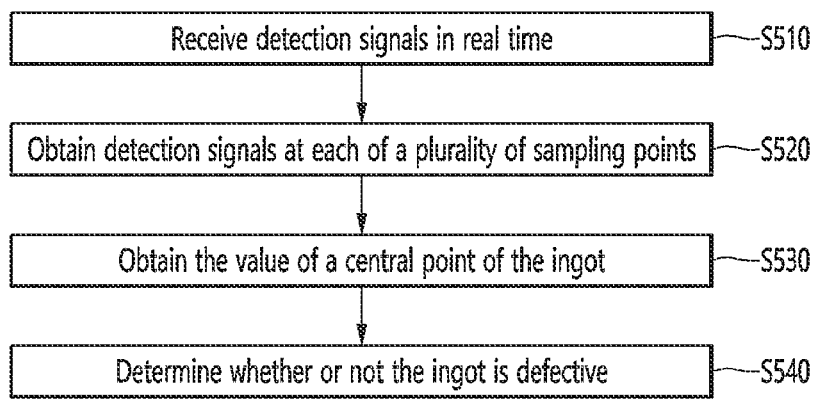
FIG. 7 is a flowchart illustrating a method of monitoring an ingot growing apparatus according to an embodiment.

FIG. 7 is a flowchart illustrating a method of monitoring an ingot growing apparatus according to an embodiment.

Referring to FIGS. 6 and 7, the controller 410 may receive a detection signal from the first sensor 130 in real time (S510).

The detection signal may be a brightness value of the meniscus area 220 detected in the detection area 210 shown in FIGS. 2 and 3. As the ingot grows while rotating and/or moving up, the entire area of the side portion of the ingot may pass through the detection area 210. When the entire area of the side of the ingot passes through the detection area 210, the brightness value of the meniscus area 220 may vary as the side portion of the ingot protrudes outward or goes inward. Therefore, the detection signal measured in real time may vary along the side circumference of the ingot and along the growth direction of the ingot.

The controller 410 may obtain detection signals at each of the plurality of sampling points SM1 to SM4 based on the detection signals sensed in real time (S520).

As shown in FIG. 9A, the detection signal at each of the plurality of sampling points SM1 to SM4 may be located in a polar coordinate system. The detection signal at each of the plurality of sampling points SM1 to SM4 varies according to the shape of the side portion of the ingot corresponding to each of the plurality of sampling points SM1 to SM4, that is, a shape that is protruded outward or recessed inward. Thus, the detection signal at each of the plurality of sampling points SM1 to SM4 may vary according to the growth direction of the ingot.

The controller 410 may obtain the value of the central point CP2 of the ingot based on the detection signal at each of the plurality of sampling points SM1 to SM4 (S530).

For example, the value of the central point CP2 of the ingot may be the value of the central point of a polygon having each of the plurality of sampling points SM1 to SM4 as a vertex. When the detection signal of each of the corresponding sampling points SM1 to SM4 varies along the growth direction of the ingot, the value of the central point CP2 of the ingot may also vary.

The controller 410 may determine whether or not the ingot is defective based on the value of the central point CP2 of the ingot (S540).

For example, the value of the central point CP2 of the ingot may coincide with the value of the central point CP1 of the chamber 100. For example, the value of the central point CP2 of the ingot is not identical to the value of the central point CP1 of the chamber 100, but the difference between the value of the central point CP2 of the ingot and the value of the central point CP1 of the chamber 100 DV may be less than or equal to the threshold value PV. For example, the value of the central point CP2 of the ingot is not identical to the value of the central point CP1 of the chamber 100, and the difference between the value of the central point CP2 of the ingot and the value of the central point CP1 of the chamber 100 DV may exceed the threshold value PV.

A method of determining whether or not an ingot is defective in these various situations will be described with reference to FIG. 8.

Figure 8:
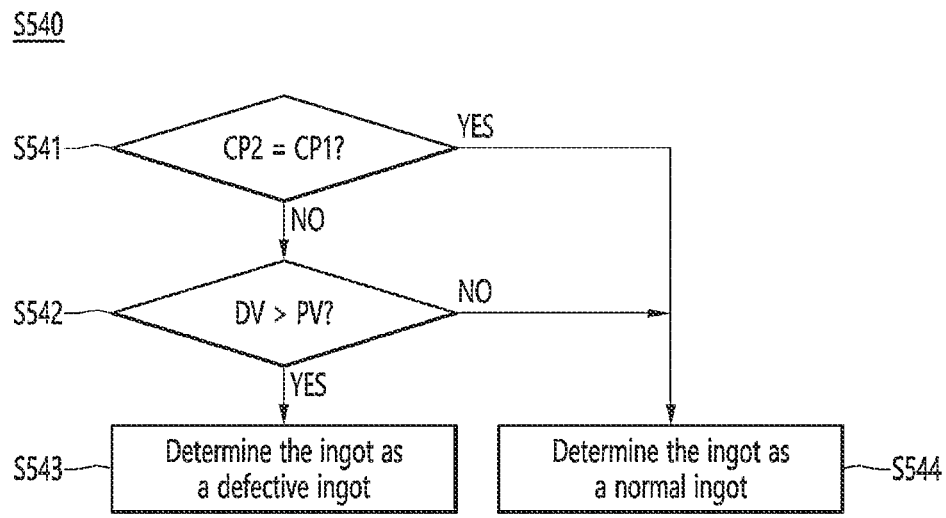
FIG. 8 is a flowchart illustrating S540 of FIG. 7 in detail.

As shown in FIG. 8, the controller 410 may determine whether or not the value of the central point CP2 of the ingot coincides with the value of the central point CP1 of the chamber 100 (S541).

When the value of the central point CP2 of the ingot is identical to the value of the central point CP1 of the chamber 100, the corresponding ingot may be determined to be a normal ingot (S544).

When the value of the central point CP2 of the ingot is identical to the value of the central point CP1 of the chamber 100, the controller 410 may determine whether or not a difference value DV between the value of the central point CP2 of the ingot and the value of the central point CP1 of the chamber 100 exceeds the threshold value PV (S542).

When the difference value DV between the value of the central point CP2 of the ingot and the value of the central point CP1 of the chamber 100 is less than or equal to the threshold value PV, the controller 410 may determine the corresponding ingot as a normal ingot (S544).

When the difference value DV between the value of the central point CP2 of the ingot and the value of the central point CP1 of the chamber 100 exceeds the threshold value PV, the controller 410 may determine the corresponding ingot as a defective ingot (S543).

Figure 12:
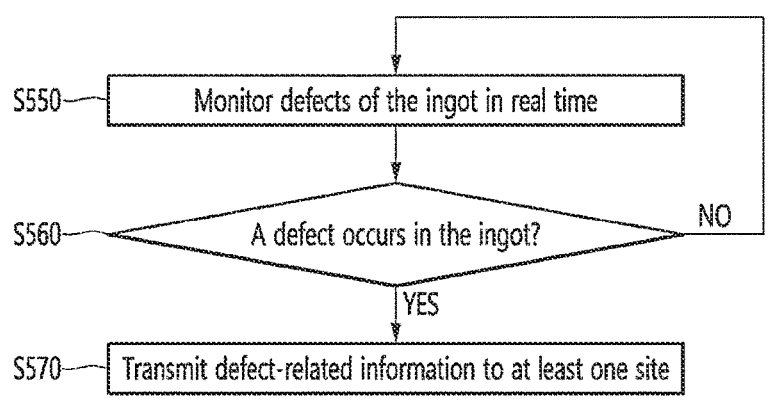
FIG. 12 is a flowchart illustrating an example of a method of processing monitoring results.

FIG. 12 is a flowchart illustrating an example of a method of processing monitoring results.

As shown in FIG. 12, the controller 410 may monitor defects of the ingot in real time (S550). S550 may include S510, S520, S530, and S540 shown in FIG. 7.

As a result of the monitoring, if a defect occurs in the ingot (S560), the controller 410 may transmit defect-related information to at least one site (S570). The defect-related information may include information shown in FIGS. 10A and 10B, information on measures to be taken when a defect occurs, information on new process conditions to be changed, and the like.

Figure 13:
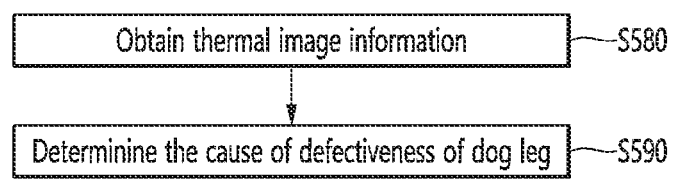
FIG. 13 is a flowchart illustrating a method of determining a cause of a defect using thermal image information.

FIG. 13 is a flowchart illustrating a method of determining a cause of a defect using thermal image information.

As shown in FIGS. 6 and 13, the second sensor 140 may obtain thermal image information (S580). The obtained thermal image information may be provided to the controller 410.

The controller 410 may analyze the cause of a dog leg based on the thermal image information (S590). That is, it may be determined whether or not the cause of the dog leg is due to temperature asymmetry or a setup problem of devices in the chamber 100 based on the thermal image information obtained by the second sensor.

For example, when the temperature distribution in an edge shape at each step included in the thermal image information is symmetrical, the corresponding ingot may be determined to be a normal ingot (FIG. 14A).

For example, when the temperature distribution in an edge shape at each step included in the thermal image information is asymmetric, the ingot may be determined to be an abnormal or asymmetric ingot (FIG. 14B).

The above detailed description should not be construed as limiting in all respects and should be considered illustrative. The scope of the embodiments should be determined by reasonable interpretation of the appended claims, and all changes within the equivalent range of the embodiments are included in the scope of the embodiments.

What is claimed is:

1. An apparatus for growing an ingot from a melt accommodated in a crucible of a chamber, comprising:
   a first sensor installed on one side of the chamber for detecting a detection signal in real time from a side portion of the ingot; and
   a controller,
   wherein the side portion of the ingot rotates via a detection area focused by the first sensor, and
   wherein the controller is configured:
   to obtain a detection signal at each of a plurality of sampling points based on detection signals detected in real time,
   to obtain a value of a central point of the ingot based on the detection signal at each of the plurality of sampling points, and
   to determine whether or not the ingot is defective based on the value of the central point of the ingot.

2. The apparatus of claim 1, wherein the detection signal includes a brightness information of a meniscus area.

3. The apparatus of claim 1, wherein the plurality of sampling points are set at least three or more along the side circumference of the ingot.

4. The apparatus of claim 1, wherein the value of the central point of the ingot is a value of a central point of a polygon having each of the plurality of sampling points as a vertex.

5. The apparatus of claim 1, wherein the controller is configured:
   to compare a difference value between the obtained value of the central point of the ingot and a value of a central point of the chamber and a threshold value, and
   to determine the ingot as defective when the obtained difference value between the obtained value of the central point of the ingot and a value of a central point of the chamber exceeds the threshold value.

6. The apparatus of claim 5, wherein the controller is configured:
   to determine the ingot as normal when the value of the obtained central point of the ingot is identical to the value of the central point of the chamber.

7. The apparatus of claim 5, wherein the controller is configured:
   to determine the ingot as normal when the difference value between the obtained value of the central point of the ingot and the value of the central point of the chamber is less than or equal to the threshold value.

8. The apparatus of claim 5, further comprising:
   a display unit,
   wherein the controller is configured:
   to display a shape of the ideal ingot, a shape of a critical loop surrounding the shape of the ideal ingot, and a shape of the ingot on the display unit.

9. The apparatus of claim 1, wherein the controller is configured:
   to monitor a defect in the ingot in real time, and
   to transmit at least one defect-related information to at least one site when the defect in the ingot occurs during the monitoring.

10. The apparatus of claim 1, further comprising:
    a second sensor configured to obtain thermal image information of the ingot,
    wherein the defect of the ingot includes a dog leg, and
    wherein the controller is configured:
    to determine whether or not the cause of the dog leg is due to temperature asymmetry or a setup problem of devices in the chamber based on the thermal image information.

11. A monitoring method in an apparatus for growing an ingot from a melt accommodated in a crucible of a chamber, the apparatus comprising a first sensor installed on one side of the chamber for detecting a detection signal in real time from a side portion of the ingot, and the side portion of the ingot rotating via a detection area focused by the first sensor, comprising:
    obtaining a detection signal at each of a plurality of sampling points based on detection signals detected in real time;
    obtaining a value of a central point of the ingot based on the detection signal at each of the plurality of sampling points; and
    determining whether or not the ingot is detective based on the value of the central point of the ingot.

12. The monitoring method of claim 11, wherein the detection signal includes brightness information of a meniscus area.

13. The monitoring method of claim 11, wherein the plurality of sampling points are set at least three or more along the side circumference of the ingot.

14. The monitoring method of claim 11, wherein the value of the central point of the ingot is a value of a central point of a polygon having each of the plurality of sampling points as a vertex.

15. The monitoring method of claim 11, wherein the determining of whether or not the ingot is defective comprises:
    comparing a difference value between the obtained value of the central point of the ingot and a value of a central point of the chamber and a threshold value; and
    determining the ingot as defective when the obtained difference value between the obtained value of the central point of the ingot and a value of a central point of the chamber exceeds the threshold value.

16. The monitoring method of claim 15, wherein the determining of whether or not the ingot is defective comprises:
    determining the ingot as normal when the value of the obtained central point of the ingot is identical to the value of the central point of the chamber.

17. The monitoring method of claim 15, wherein the determining of whether or not the ingot is defective comprises:
    determining the ingot as normal when the difference value between the obtained value of the central point of the ingot and the value of the central point of the chamber is less than or equal to the threshold value.

18. The monitoring method of claim 15, wherein the apparatus comprises a display unit, comprising:
 displaying a shape of the ideal ingot, a shape of a critical loop surrounding the shape of the ideal ingot, and a shape of the ingot on the display unit.

19. The monitoring method of claim 11, comprising:
 monitoring a defect in the ingot in real time; and
 transmitting at least one defect-related information to at least one site when the defect in the ingot occurs during the monitoring.

20. The monitoring method of claim 11, wherein the apparatus comprises a second sensor configured to obtain thermal image information of the ingot,
 wherein the defect of the ingot includes a dog leg, and comprising:
 determining whether or not the cause of the dog leg is due to temperature asymmetry or a setup problem of devices in the chamber based on the thermal image information.

* * * * *

UNITED STATES PATENT AND TRADEMARK OFFICE
CERTIFICATE OF CORRECTION

PATENT NO. : 12,247,939 B2  
APPLICATION NO. : 18/172951  
DATED : March 11, 2025  
INVENTOR(S) : Min Jae Yoon Page 1 of 1

It is certified that error appears in the above-identified patent and that said Letters Patent is hereby corrected as shown below:

In the Claims

In Column 14, Line 31, in Claim 11, delete "detective" and insert -- defective --.

In Column 14, Line 34, in Claim 12, after "includes" insert -- a --.

Signed and Sealed this  
Fifteenth Day of July, 2025

Coke Morgan Stewart  
*Acting Director of the United States Patent and Trademark Office*